United States Patent
Lim et al.

(10) Patent No.: US 11,756,908 B2
(45) Date of Patent: Sep. 12, 2023

(54) PACKAGE SUBSTRATE INCLUDING A REDISTRIBUTION PAD EXTENDING FROM A REDISTRIBUTION LAYER AND INCLUDING SEGMENTING GROOVES ALONG A REDIAL DIRECTION THEREOF AND SEMICONDUCTOR PACKAGE INCLUDING THE SAME

(71) Applicant: Samsung Electronics Co., Ltd., Suwon-si (KR)

(72) Inventors: Youngkyu Lim, Cheonan-si (KR); Gookmi Song, Hwaseong-si (KR); Sunguk Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/718,639

(22) Filed: Apr. 12, 2022

(65) Prior Publication Data

US 2022/0238469 A1   Jul. 28, 2022

Related U.S. Application Data

(63) Continuation of application No. 16/930,517, filed on Jul. 16, 2020, now Pat. No. 11,302,661.

(30) Foreign Application Priority Data

Dec. 26, 2019 (KR) .......................... 10-2019-0174773

(51) Int. Cl.
*H01L 23/00* (2006.01)

(52) U.S. Cl.
CPC .............. *H01L 24/05* (2013.01); *H01L 24/20* (2013.01); *H01L 2224/0401* (2013.01); *H01L 2224/05011* (2013.01); *H01L 2924/3512* (2013.01)

(58) Field of Classification Search
CPC . H01L 24/05; H01L 24/20; H01L 2224/0401; H01L 2224/05011; H01L 2924/3512
See application file for complete search history.

(56) References Cited

U.S. PATENT DOCUMENTS

| | | | |
|---|---|---|---|
| 6,825,541 B2 * | 11/2004 | Huang | .............. H01L 24/05 257/676 |
| 7,741,714 B2 | 6/2010 | Huang et al. | |
| 7,859,122 B2 | 12/2010 | Daubenspeck et al. | |

(Continued)

*Primary Examiner* — Mamadou L Diallo
(74) *Attorney, Agent, or Firm* — Harness, Dickey & Pierce, P.L.C.

(57) ABSTRACT

A package substrate may include an insulation substrate, at least one redistribution layer (RDL) and a redistribution pad. The RDL may be included in the insulation substrate. The redistribution pad may extend from the RDL. The redistribution pad may include at least one segmenting groove in a radial direction of the redistribution pad. Thus, the at least one segmenting groove in the radial direction of the redistribution pad may reduce an area of the redistribution pad. Therefore, application of physical stress to a PID disposed over the redistribution pad may be suppressed, and thus generation of cracks in the PID may be reduced. Further, spreading of the cracks toward the redistribution pad from the PID may also be suppressed, and thus reliability the semiconductor package may be improved.

20 Claims, 12 Drawing Sheets

(56) References Cited

U.S. PATENT DOCUMENTS

| | | | |
|---|---|---|---|
| 9,349,665 | B2 | 5/2016 | Chen et al. |
| 9,922,950 | B2 | 3/2018 | Gao |
| 9,929,112 | B2* | 3/2018 | Hsieh ................... H01L 24/03 |
| 10,008,462 | B2 | 6/2018 | Seo et al. |
| 10,504,826 | B1* | 12/2019 | Fillion .................. H01L 24/20 |
| 2002/0125584 | A1* | 9/2002 | Umehara ............... H01L 24/85 |
| | | | 257/784 |
| 2004/0070079 | A1* | 4/2004 | Huang .................. H01L 24/05 |
| | | | 257/E23.021 |
| 2007/0114639 | A1* | 5/2007 | Lin ................... H01L 23/3114 |
| | | | 257/E23.021 |
| 2011/0254154 | A1* | 10/2011 | Topacio ............... H01L 23/562 |
| | | | 257/737 |
| 2013/0113095 | A1 | 5/2013 | Chuang et al. |
| 2013/0256871 | A1* | 10/2013 | Topacio ............. H01L 23/3171 |
| | | | 257/E21.511 |
| 2015/0287688 | A1* | 10/2015 | Lin ................... H01L 23/3171 |
| | | | 257/738 |
| 2016/0027712 | A1* | 1/2016 | Hu .................. H01L 23/49833 |
| | | | 174/262 |
| 2016/0322337 | A1* | 11/2016 | Liang ..................... H01L 24/19 |
| 2017/0358534 | A1* | 12/2017 | Kim ................... H01L 23/3114 |
| 2018/0366410 | A1* | 12/2018 | Chen .................. H01L 23/3114 |
| 2018/0374769 | A1 | 12/2018 | Fehler et al. |
| 2019/0067199 | A1* | 2/2019 | Takizawa ............ H01L 23/5389 |
| 2019/0103353 | A1* | 4/2019 | Liu ..................... H01L 25/0655 |
| 2019/0181534 | A1* | 6/2019 | Chen ....................... H01Q 1/38 |
| 2019/0318994 | A1* | 10/2019 | Kweon ................. H01L 21/563 |
| 2020/0111829 | A1* | 4/2020 | Fan ........................ H01L 24/29 |
| 2020/0135619 | A1* | 4/2020 | Dinkel .................... H01L 24/92 |
| 2020/0144179 | A1* | 5/2020 | Chen ...................... H01L 24/09 |
| 2020/0294915 | A1* | 9/2020 | Chu ....................... H01L 24/14 |
| 2020/0303313 | A1* | 9/2020 | Leitgeb .................. H01L 24/08 |
| 2021/0134744 | A1* | 5/2021 | Chien .................... H01L 24/03 |
| 2021/0202358 | A1* | 7/2021 | Tsao .................... H01L 21/6835 |
| 2021/0202363 | A1* | 7/2021 | Chang Chien ...... H01L 23/5384 |
| 2021/0202415 | A1* | 7/2021 | Kim ....................... H01L 24/02 |

* cited by examiner

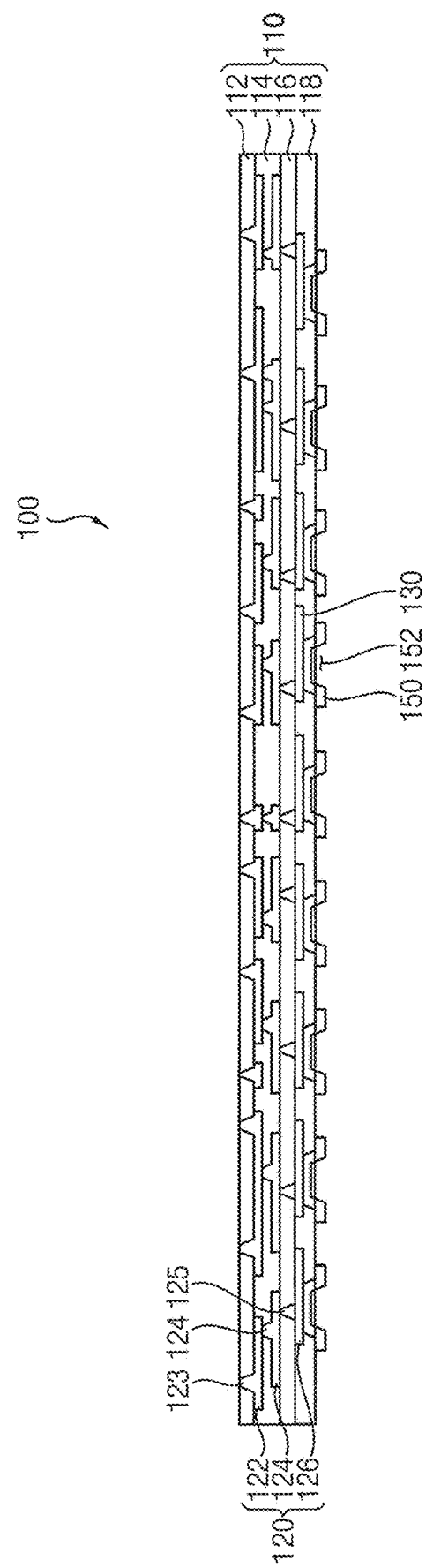

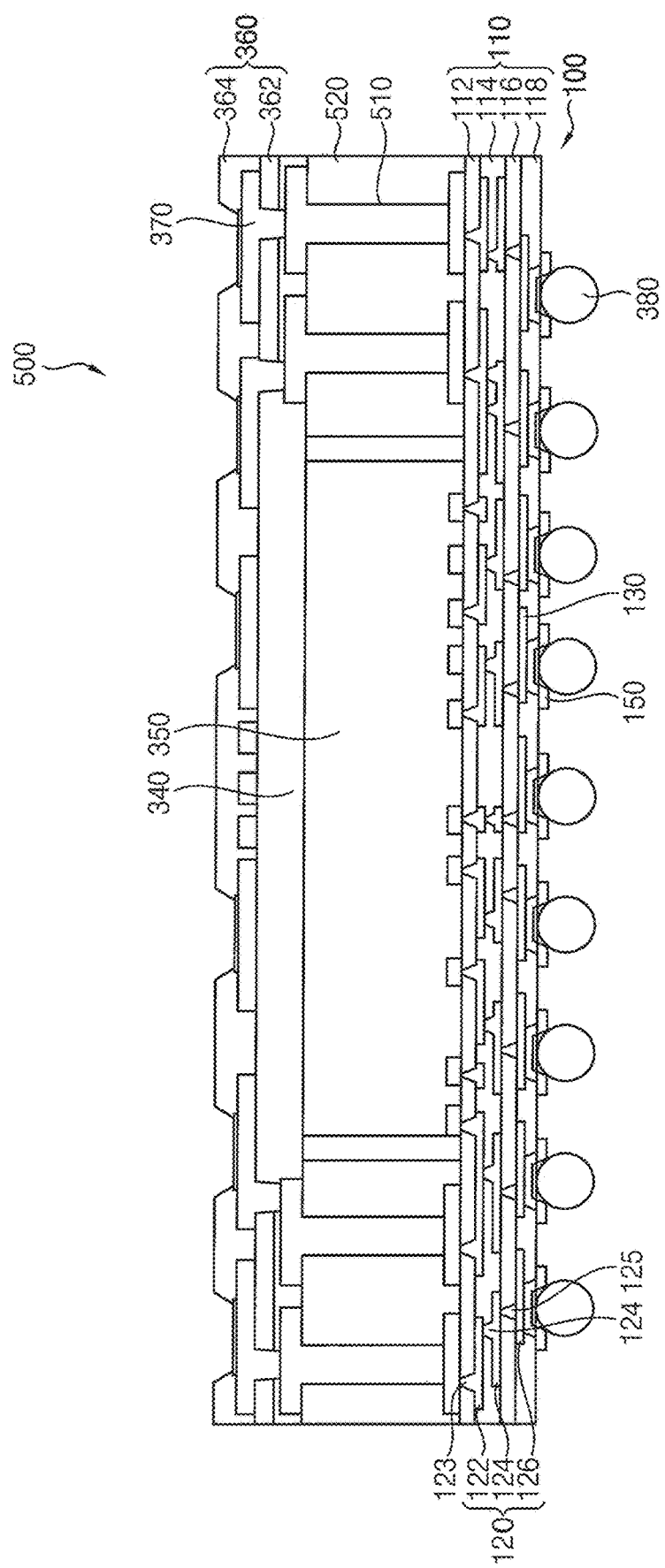

PACKAGE SUBSTRATE INCLUDING A REDISTRIBUTION PAD EXTENDING FROM A REDISTRIBUTION LAYER AND INCLUDING SEGMENTING GROOVES ALONG A REDIAL DIRECTION THEREOF AND SEMICONDUCTOR PACKAGE INCLUDING THE SAME

CROSS-RELATED APPLICATION

This application is a continuation of U.S. application Ser. No. 16/930,517, filed on Jul. 16, 2020, which claims priority under 35 USC § 119 to Korean Patent Application No. 10-2019-0174773, filed on Dec. 26, 2019 in the Korean Intellectual Property Office (KIPO), the contents of each of which are herein incorporated by reference in their entirety.

BACKGROUND

1. Field

Example embodiments relate to package substrates and semiconductor packages including the same. More particularly, example embodiments relate to package substrates including a redistribution layer and a pad, and semiconductor packages including the package substrate.

2. Description of the Related Art

Generally, a fan-out type semiconductor package may include a frame having a cavity, a semiconductor chip arranged in the cavity, a package substrate arranged on a lower surface of the frame, and external terminals mounted on the package substrate. The package substrate may include a photoimageable dielectric (PID) formed on the lower surface of the frame, a lower redistribution layer (RDL) formed in the PID and electrically connected with the semiconductor chip, and a redistribution pad extended from the lower RDL. The external terminals may be mounted on the redistribution pad.

According to related arts, the redistribution pad and the PID may have different thermal expansion coefficients (TEC). Thus, physical stress may be applied to the PID disposed over the redistribution pad and thus a crack may be generated in the PID. The crack may spread into the redistribution pad to damage the redistribution pad.

SUMMARY

Example embodiments provide package substrates that may be capable of suppressing a crack from being generated in a photoimageable dielectric.

Example embodiments also provide semiconductor packages including the above-mentioned package substrate.

According to an example embodiment, a package substrate includes an insulation substrate, at least one redistribution layer (RDL) included in the insulation substrate, and a redistribution pad extending from the RDL and including at least one segmenting groove formed in a radial direction of the redistribution pad.

According to an example embodiment, a package substrate includes an insulation substrate, at least one redistribution layer (RDL) included in the insulation substrate, and a redistribution pad extending from the RDL. The RDL may be included in the insulation substrate. The redistribution pad may include a central pad, a plurality of connection pads extending from the central pad in a radial direction of the redistribution pad, a plurality of branch pads extending from the connection pads in the radial direction and connected with the RDL, and a plurality of rims connecting the branch pads with each other.

According to example embodiments, a semiconductor package includes a package substrate, a semiconductor chip and external terminals. The package substrate may include an insulation substrate, at least one redistribution layer (RDL) included in the insulation substrate. The redistribution pad may extend from the RDL. The redistribution pad may include at least one segmenting groove in a radial direction of the redistribution pad. The semiconductor chip may be arranged on an upper surface of the package substrate. The semiconductor chip may be electrically connected to the RDL. The external terminals may be on the redistribution pad.

According to an example embodiment, a fan-out type semiconductor package includes a frame, a semiconductor chip, a lower photoimageable dielectric (PID), a lower redistribution layer (RDL), and a plurality of redistribution pads. The frame may have a cavity. The semiconductor chip may be in the cavity. The lower PID may be arranged on a lower surface of the frame. The lower RDL may be in the lower PID. The lower RDL may be electrically connected to the semiconductor chip. The redistribution pads may extend from the lower RDL. Each of the redistribution pads may include at least one segmenting groove in a radial direction of the redistribution pad.

According to an example embodiment, a fan-out type semiconductor package includes a frame, a semiconductor chip, a molding member, a lower photoimageable dielectric (PID), a lower redistribution layer (RDL), a plurality of redistribution pads, a plurality of under bump metal (UBM) layers, external terminals, an upper PID and an upper RDL. The frame may include a middle RDL and a cavity. The semiconductor chip may be in the cavity. The molding member may be on an upper surface of the frame to fill a space between an inner surface of the cavity and the semiconductor chip. The lower PID may be on a lower surface of the frame. The lower RDL may be in the lower PID. The lower RDL may be electrically connected to the middle RDL and the semiconductor chip. The redistribution pads may extend from the lower RDL. Each of the redistribution pads may include a plurality of first segmenting grooves in a radial direction of the redistribution pad and a plurality of second segmenting grooves extending from the first segmenting grooves. The UBM layers may be on the redistribution pads. The external terminals may be on the UBM layers. The upper PID may be on an upper surface of the molding member. The upper RDL may be in the upper PID. The upper RDL may be electrically connected to the middle RDL. Each of the first segmenting grooves may extend from an outer surface of the redistribution pad to a central portion of the redistribution pad along the radial direction. Each of the second segmenting grooves may extend from an inner end of each of the first segmenting grooves toward the central portion of the redistribution pad. A length of each of the first segmenting grooves in the radial direction may be about 19% to about 22% of a radius of the redistribution pad. A length of each of the second segmenting grooves in the radial direction may be about 5% to about 7% of the radius of the redistribution pad.

According to an example embodiment, a fan-out type semiconductor package may include a frame, a semiconductor chip, a molding member, a lower photoimageable dielectric (PID), a lower redistribution layer (RDL), a plurality of redistribution pads, a plurality of under bump metal (UBM) layers, external terminals, an upper PID and an upper RDL. The frame may include a middle RDL and a cavity. The semiconductor chip may be in the cavity. The molding member may be on an upper surface of the frame to fill a space between an inner surface of the cavity and the semiconductor chip. The lower PID may be on a lower surface of the frame. The lower RDL may be in the lower PID. The lower RDL may be electrically connected to the middle RDL and the semiconductor chip. The redistribution pads may extend from the lower RDL. Each of the redistribution pads may include a plurality of first segmenting grooves in a radial direction of the redistribution pad and a plurality of second segmenting grooves isolated from the first segmenting grooves. The UBM layers may be on the redistribution pads. The external terminals may be on the UBM layers. The upper PID may be on an upper surface of the molding member. The upper RDL may be in the upper PID. The upper RDL may be electrically connected to the middle RDL. Each of the first segmenting grooves may extend from an outer surface of the redistribution pad to a central portion of the redistribution pad along the radial direction. Each of the second segmenting grooves may be between the first segmenting groove and the central portion of the redistribution pad. A length of each of the first segmenting grooves in the radial direction may be about 3% to about 5% of a radius of the redistribution pad. A length of each of the second segmenting grooves in the radial direction may be about 5% to about 7% of the radius of the redistribution pad.

According to an example embodiment, a package substrate includes an insulation substrate, at least one redistribution layer (RDL) included in the insulation substrate, and a redistribution pad including a central pad, a plurality of connection pads extending from the central pad in a radial direction of the redistribution pad, a plurality of branch pads extending from the connection pads in the radial direction and connected to the RDL, and a plurality of rims connected between the branch pads.

According to some example embodiments, the at least one segmenting groove formed in the radial direction of the redistribution pad may reduce an area of the redistribution pad. Thus, physical stress to the PID disposed over the redistribution pad may be suppressed, thereby reducing generation of cracks in the PID. Thus, spreading of the cracks toward the redistribution pad from the PID may also be suppressed to provide the semiconductor package with improved reliability.

BRIEF DESCRIPTION OF THE DRAWINGS

Example embodiments will be more clearly understood from the following detailed description taken in conjunction with the accompanying drawings. FIGS. 1 to 13 represent non-limiting, example embodiments as described herein.

FIG. 1 is a cross-sectional view illustrating a package substrate in accordance with an example embodiment;

FIG. 3 is a cross-sectional view taken along a line in FIG. 2A;

FIG. 4 is a bottom view illustrating a redistribution pad of a package substrate in accordance with some example embodiments;

FIG. 7 is a cross-sectional view taken along a line VII-VII' in FIG. 6A;

FIG. 8 is a cross-sectional view illustrating a semiconductor package in accordance with an example embodiment;

FIG. 9 is a cross-sectional view illustrating a semiconductor package in accordance with an example embodiment;

FIG. 10 is a cross-sectional view illustrating a fan-out type semiconductor package in accordance with an example embodiment;

FIG. 11 is an enlarged cross-sectional view illustrating a redistribution pad of the fan-out type semiconductor package in FIG. 10;

FIG. 12 is a cross-sectional view illustrating a semiconductor package in accordance with an example embodiment; and FIG. 13 is a cross-sectional view illustrating a semiconductor package in accordance with an example embodiment.

DETAILED DESCRIPTION

Hereinafter, example embodiments will be explained in detail with reference to the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2A:
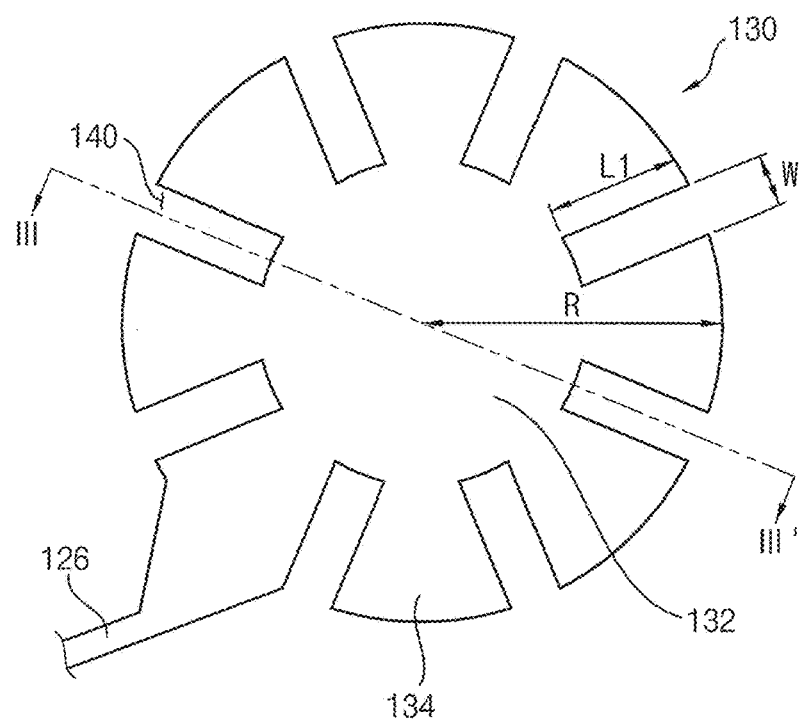
FIGS. 2A and 2B are bottom views illustrating a redistribution pad of the package substrate in FIG. 1.
Figure 2B:
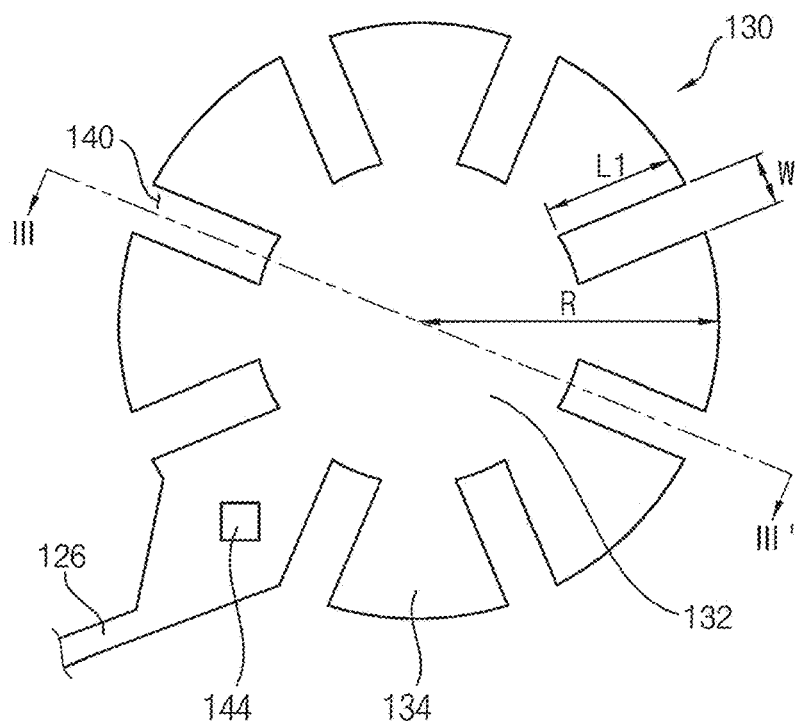
Figure 3:
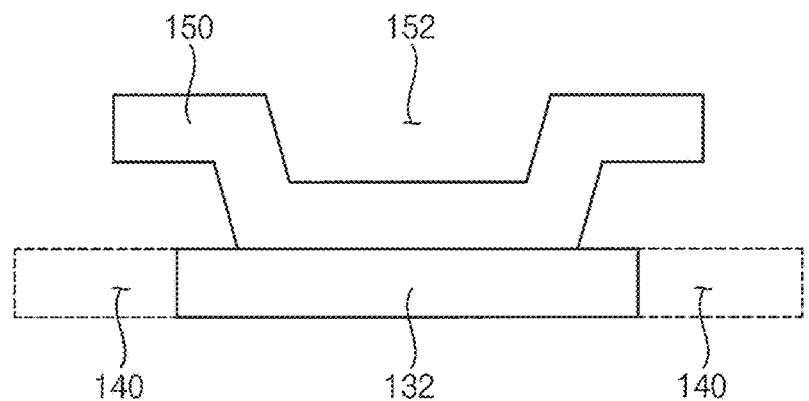

FIG. 1 is a cross-sectional view illustrating a package substrate in accordance with an example embodiment, FIGS. 2A and 2B are bottom views illustrating a redistribution pad of the package substrate in FIG. 1, and FIG. 3 is a cross-sectional view taken along a line in FIG. 2A.

Referring to FIG. 1, a package substrate 100 of some example embodiments may include an insulation substrate 110, a redistribution layer (RDL) 120, a plurality of redistribution pads 130 and a plurality of under bump metal (UBM) layers 150.

The insulation substrate 110 may include first to fourth insulation layers 112, 114, 116 and 118. The third insulation layer 116 may be arranged on an upper surface of the fourth insulation layer 118. The second insulation layer 114 may be arranged on an upper surface of the third insulation layer 116. The first insulation layer 112 may be arranged on an upper surface of the second insulation layer 114. In some example embodiments, the insulation substrate 110 may include a single insulation layer, two, three or at least five insulation layers. In some example embodiments, the insulation substrate 110 may include a photoimageable dielectric (PID). Alternatively, the insulation substrate 110 may include other insulation materials besides the PID.

The RDL 120 may be included in the insulation layer 110. In some example embodiments, the RDL 120 may include first to third RDLs 122, 124 and 126. The first RDL 122 may be arranged between the first insulation layer 112 and the second insulation layer 114. The second RDL 124 may be arranged between the second insulation layer 114 and the third insulation layer 116. The third RDL 126 may be arranged between the third insulation layer 116 and the fourth insulation layer 118. Numbers of the RDLs 120 may be determined in accordance with numbers of the insulation substrate 110. In some example embodiments, the RDL 120 may include metal such as copper.

A first contact 123 may be formed in the first insulation layer 112. The first contact 123 may be vertically extended from the first RDL 122. The first contact 123 may be exposed through an upper surface of the first insulation layer 112. A second contact 125 may be vertically formed through the second insulation layer 114. The second contact 125 may connect the first RDL 122 to the second RDL 124. A third contact 127 may be vertically formed through the third insulation layer 116. The third contact 127 may connect the second RDL 124 to the third RDL 126.

The redistribution pads 130 may be extended from the third RDL 126 on a lower surface of the third insulation layer 116. Thus, the redistribution pads 130 may be a part of the third RDL 126. The redistribution pads 130 may be exposed through openings formed at a lower surface of the fourth insulation layer 118.

The UBM layers 150 may be formed on the redistribution pads 130. Each of the UBM layers 150 may be formed on a lower surface of the redistribution pad 130, an inner surface of the opening and the lower surface of the fourth insulation layer 118. Thus, each of the UBM layers 150 may include a via 152 positioned over the redistribution pad 130.

The fourth insulation layer 118 may be configured to fill a space between the UBM layer 150 and the redistribution pad 130. The fourth insulation layer 118 may have a thermal expansion coefficient (TEC) higher than a TEC of the redistribution pad 130. Thus, high physical stress may be applied to a portion of the fourth insulation layer 118 over the redistribution pad 130 due to expansion and contraction of the fourth insulation layer 118 in accordance with temperatures. The physical stress may cause a crack in the portion of the fourth insulation layer 118. The crack may spread into the redistribution pad 130 to generate damages of the redistribution pad 130.

In order to reduce the physical stress applied to the portion of the fourth insulation layer 118, as shown in FIGS. 2A and 3, each of the redistribution pads 130 may include at least one segmenting groove 140. The segmenting groove 140 may decrease an area of the redistribution pad 130, and thus the physical stress applied to the fourth insulation layer 118 disposed over the redistribution pad 130 may be reduced.

In some example embodiments, the segmenting groove 140 may be extended from a central portion of the redistribution pad 130 in a radial direction. Further, the segmenting groove 140 may include a plurality of grooves arranged spaced apart from each other by a uniform gap with respect to the central portion of the redistribution pad 130. Because the redistribution pad 130 may not exist in regions where the segmenting grooves 140 are provided, the area of the redistribution pad 130 may be decreased by a total area of the segmenting grooves 140.

The redistribution pad 130 may be divided into a central pad (or alternatively, a central pad portion) 132 and a plurality of branch pads (or alternatively, a plurality of branch pad portions) 134 by the segmenting grooves 140. The branch pads 134 may be separated from each other by the segmenting grooves 140. The UBM layer 150 may be arranged on an upper surface of the central pad 132. Spaces between the branch pads 134, i.e., the segmenting grooves 140 may be filled with the fourth insulation layer 118.

For example, each of the segmenting grooves 140 may extend from an outer surface of the redistribution pad 130 toward the central portion of the redistribution pad 130 in the radial direction. Further, a length (or alternatively, a depth) L1 of the segmenting groove 140 in the radial direction may be shorter than a radius R of the redistribution pad 130. In some example embodiments, the length L1 of the segmenting groove 140 in the radial direction may be about 19% to about 22% of the radius R of the redistribution pad 130. For example, when the radius R of the redistribution pad 130 may be about 290 µm, the length L1 of the segmenting groove 140 in the radial direction may be about 55 µm to about 65 µm. Further, the segmenting groove 140 may have a uniform width W1. For example, the width W1 of the segmenting groove 140 may be about 20 µm to about 35 µm.

The redistribution pad 130 having the segmenting grooves 140 may be formed by an exposure process performed on the third RDL 126 on the lower surface of the third insulation layer 116 using a mask, which may include a mask pattern corresponding to a shape of the segmenting groove 140.

Further, as shown in FIG. 2B, the redistribution pad 130 may further include a third segmenting groove 144. The third segmenting groove 144 may be formed at a portion of the redistribution pad 130 connected to the third RDL 126.

Figure 4:
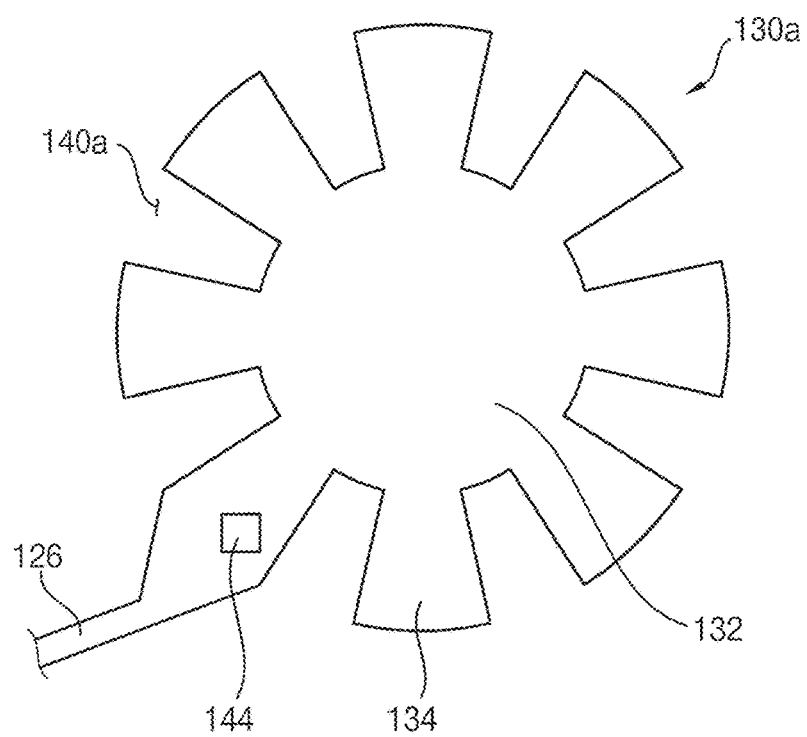

FIG. 4 is a bottom view illustrating a redistribution pad of a package substrate in accordance with an example embodiment.

A redistribution pad 130a of an example embodiment may have a structure the same as or substantially similar to that of the redistribution pad 130 in FIG. 2 except for a shape of a segmenting groove.

Referring to FIG. 4, the segmenting groove 140a may have widths gradually decreasing from an outer surface of a redistribution pad 130a toward a central portion of the redistribution pad 130a.

In some example embodiments, the segmenting groove 140a may have widths gradually decreasing from the central portion of the redistribution pad 130a toward the outer surface of the redistribution pad 130a.

Further, the redistribution pad 130a may include the third segmenting groove 144. In some example embodiments, the redistribution pad 130a may not include the third segmenting groove 144.

Figure 5A:
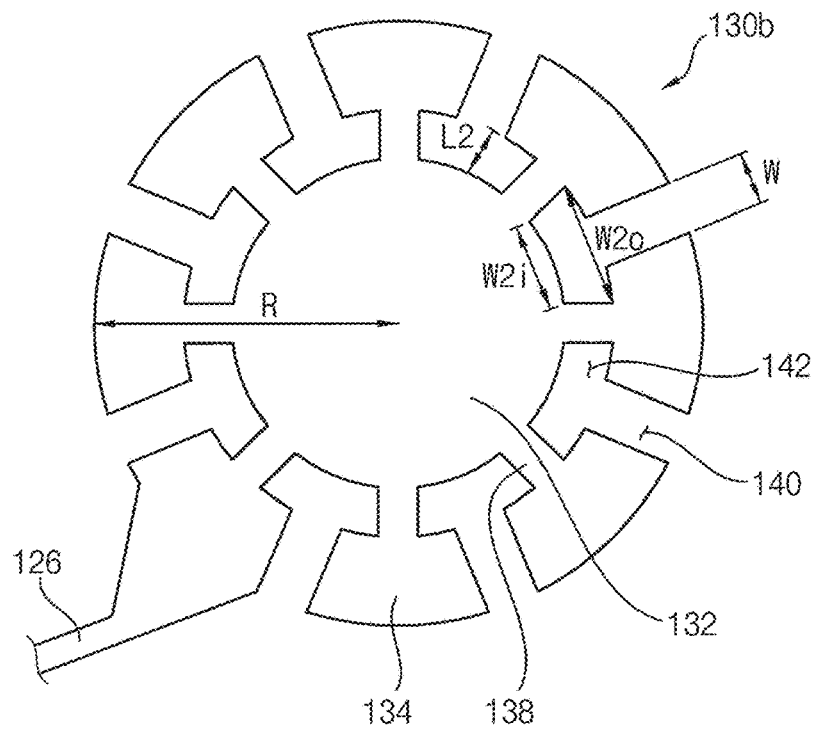
FIGS. 5A and 5B are bottom views illustrating a redistribution pad of a package substrate in accordance with some example embodiments.
Figure 5B:
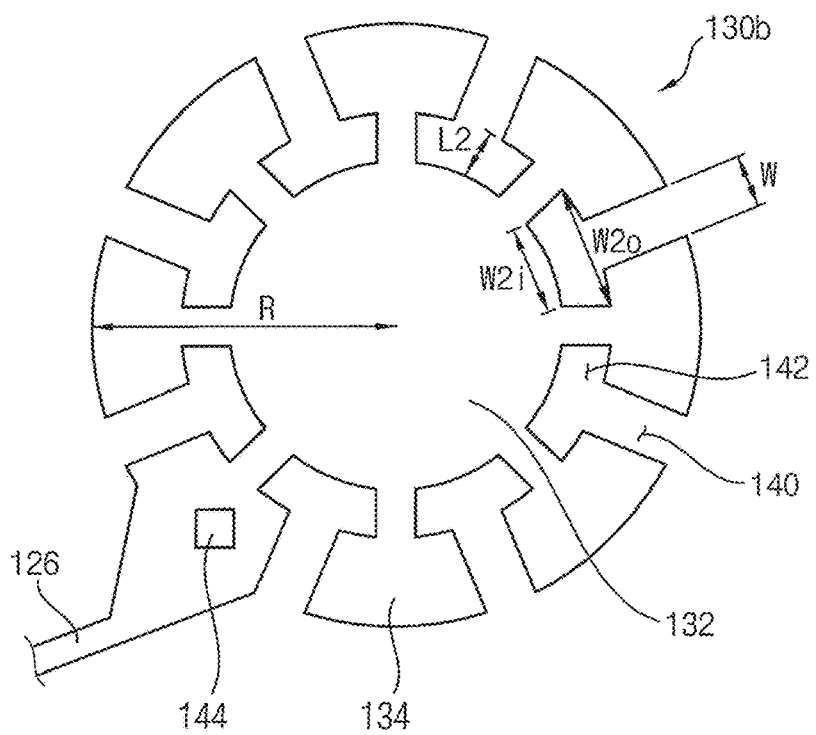

FIGS. 5A and 5B are bottom views illustrating a redistribution pad of a package substrate in accordance with some example embodiments.

A redistribution pad 130b of some example embodiments may have a structure the same as or substantially similar to that of the redistribution pad 130 in FIG. 2 except for a shape of a segmenting groove.

Referring to FIG. 5A, the redistribution pad 130b may further include a second segmenting groove 142. The second segmenting groove 142 may be positioned between the segmenting groove 140 and a central portion of the redistribution pad 130b. A segmenting groove of some example embodiments may be divided into the first segmenting groove 140 and the second segmenting groove 142 by forming the second segmenting groove 142.

In some example embodiments, the second segmenting groove 142 may be connected to the segmenting groove 140. In some example embodiments, the second segmenting groove 142 may extend from an inner end of the segmenting groove 140 toward the central portion of the redistribution pad 130*b*. The second segment groove 142 may include a plurality of grooves, and the plurality of grooves of the second segment groove 142 may be provided along a circumferential direction of the redistribution pad 130*b*. Further, the second segmenting groove 142 may have a width wider than a width of the segmenting groove 140.

In some example embodiments, a length (or alternatively, a depth) L2 of the second segmenting groove 142 in the radial direction may be about 5% to about 7% of the radius R of the redistribution pad 130*b*. For example, when the radius R of the redistribution pad 130*b* may be about 290 μm, the length L2 of the second segmenting groove 142 in the radial direction may be about 15 μm to about 20 μm.

Further, the second segmenting groove 142 may have widths gradually decreasing from the outer surface of the redistribution pad 130*b* to the central portion of the redistribution pad 130*b*. For example, an innermost width W2*i* among the widths of the second segmenting groove 142 may be about 35 μm to about 45 μm and an outermost width W2*o* among the widths of the second segmenting groove 142 may be about 48 μm to about 58 μm. In some example embodiments, the second segmenting groove 142 may have a uniform width.

For example, the redistribution pad 130*b* may include the central pad 132, the branch pads 134 and connection pads 138. The connection pads 138 may extend from the outer surface of the central pad 132 in the radial direction. The connection pads 138 may be spaced apart from each other by a uniform gap to form the second segmenting grooves 142 between the connection pads 138.

The branch pads 134 may extend from outer surfaces of the connection pads 138 in the radial direction. That is, the connection pads 138 connect the central pad 132 to the branch pads 134. The first segmenting grooves 140 may be formed between the branch pads 134. Because the width of the first segmenting groove 140 may be narrower than the width of the second segmenting groove 142, each of the branch pads 134 may have a width wider than a width of each of the connection pads 138.

Further, as shown in FIG. 5B, the redistribution pad 130*b* may further include a third segmenting groove 144. The third segmenting groove 144 may be formed at the portion of the redistribution pad 130*b* connected to the third RDL 126.

Figure 6A:
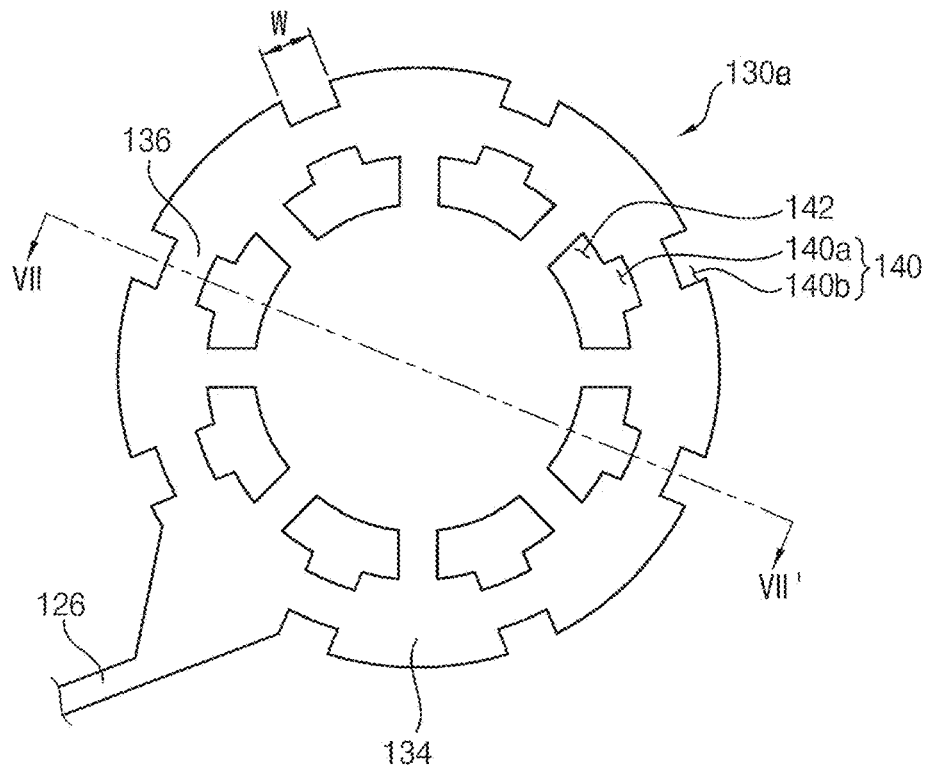
FIGS. 6A and 6B are bottom views illustrating a redistribution pad of a package substrate in accordance with some example embodiments.
Figure 6B:
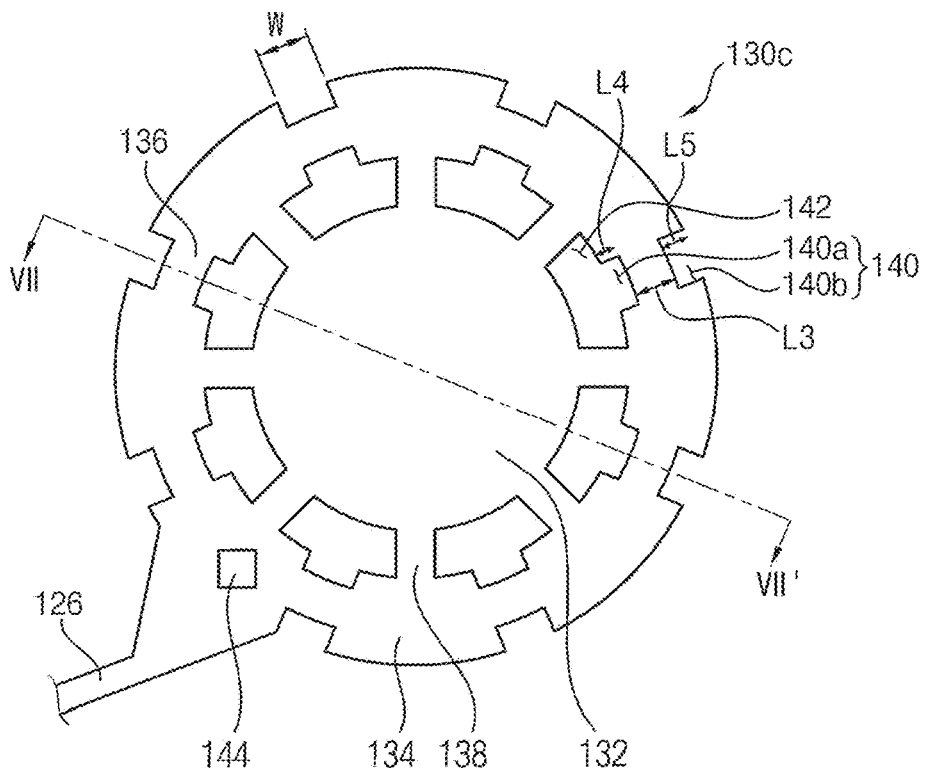
Figure 7:
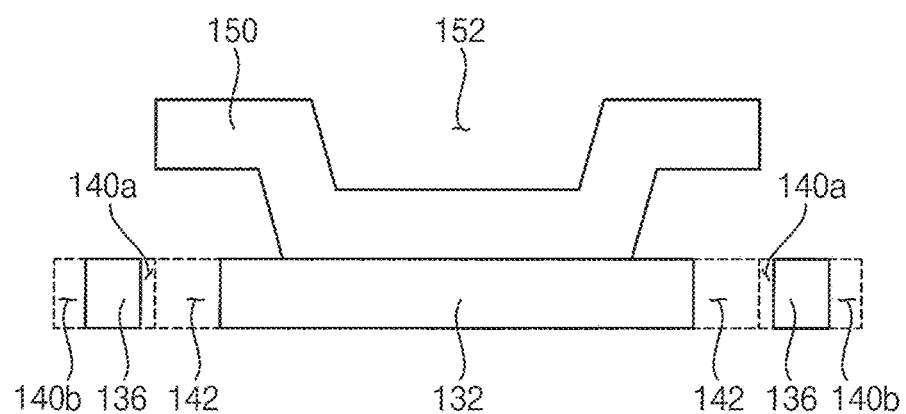

FIGS. 6A and 6B are bottom views illustrating a redistribution pad of a package substrate in accordance with some example embodiments, and FIG. 7 is a cross-sectional view taken along a line VII-VII' in FIG. 6A.

A redistribution pad 130*c* of some example embodiments may have a structure the same as or substantially similar to that of the redistribution pad 130 in FIG. 2 except for a shape of a segmenting groove.

Referring to FIGS. 6A and 7, the redistribution pad 130*c* may further include a rim 136 connected between the branch pads 134. The rim 136 may be positioned in the first segmenting groove 140. The rim 136 may be formed in the first segmenting groove 140 along the circumferential direction of the redistribution pad 130*c*. Thus, the adjacent branch pads 134 may be connected with each other via the rim 136. Further, the first segmenting groove 140 may be divided into an inner segmenting groove 140*a* and an outer segmenting groove 140*b* by the rim 136. Further, the second segmenting groove 142 may be isolated from the first segmenting groove 140, particularly, the outer segmenting groove 140*b* by the rim 136. Thus, a length of the first segmenting groove 140 in the radial direction may be about 3% to about 5% of the radius R of the redistribution pad 130*c*.

In some example embodiments, a length L3 of the rim 136 in the radial direction may be about 30 μm. Thus, a length L4 of the inner segmenting groove 140*a* in the radial direction may be about 5 μm and a length L5 of the outer segmenting groove 140*b* in the radial direction may be about 10 μm.

Further, in some example embodiments, one rim 136 may be formed in the first segmenting groove 140. In some example embodiments, at least two rims 136 may be formed in the first segmenting groove 140. Further, the rim 136 may be formed in the second segmenting groove 142.

For example, the redistribution pad 130*c* may include the central pad 132, the branch pads 134, the connection pads 138 and the rims 136. The central pad 132, the branch pads 134 and the connection pads 138 may have structures the same as or substantially similar to those of the central pad 132, the branch pads 134 and the connection pads 138 in FIG. 5A, respectively. Thus, any further illustrations with respect to the central pad 132, the branch pads 134 and the connection pads 138 may be omitted herein for brevity.

The rims 136 may be formed in the first segmenting groove 140 along the circumferential direction of the redistribution pad 130*c*. Each of the rims 136 may connect the adjacent branch pads 134 with each other. As mentioned above, each of the rims 136 may be configured to divide the first segmenting groove 140 into the inner segmenting groove 140*a* and the outer segmenting groove 140*b*.

Further, as shown in FIG. 6B, the redistribution pad 130*c* may further include the third segmenting groove 144. The third segmenting groove 144 may be formed at the portion of the redistribution pad 130*c* connected to the third RDL 126.

Figure 8:
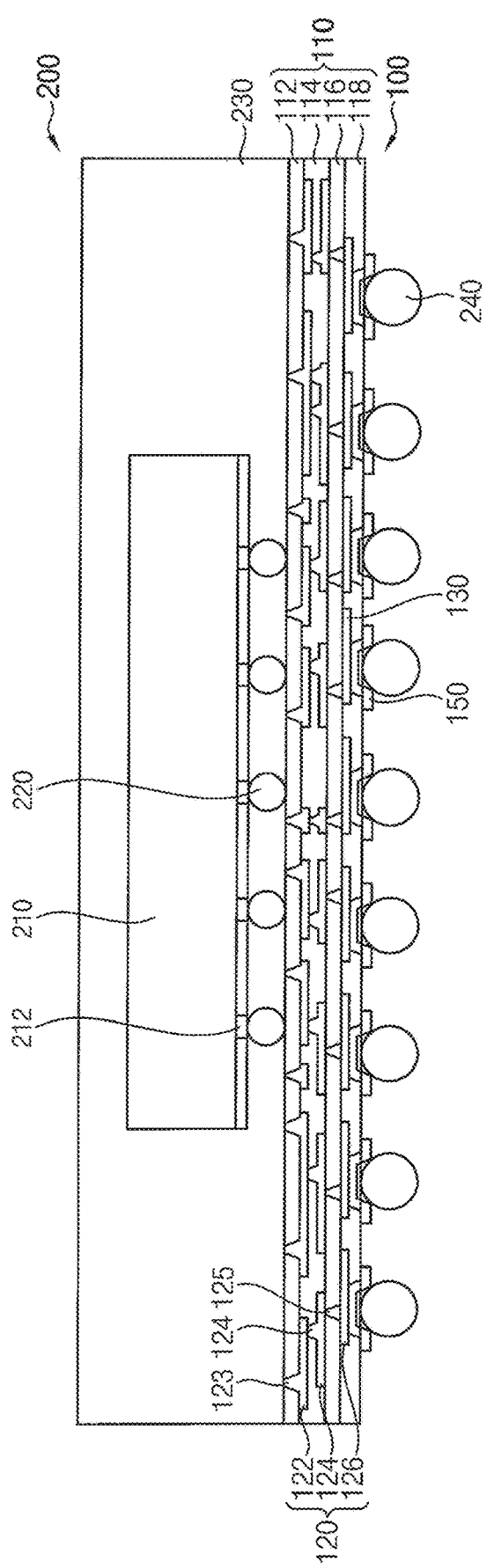

FIG. 8 is a cross-sectional view illustrating a semiconductor package in accordance with an example embodiment.

Referring to FIG. 8, a semiconductor package 200 of some example embodiments may include a package substrate 100, a semiconductor chip 210, conductive bumps 220, a molding member 230 and external terminals 240.

The package substrate 100 may include the redistribution pad 130 in FIG. 2A or FIG. 2B, the redistribution pad 130*a* in FIG. 4, the redistribution pad 130*b* in FIG. 5A or FIG. 5B, or the redistribution pad 130*c* in FIG. 6A or FIG. 6B. Further, the package substrate 100 may have a structure the same as or substantially similar to that of the package substrate 100 in FIG. 1. Thus, any further illustrations with respect to the package substrate 100 may be omitted herein for brevity.

The semiconductor chip 210 may be arranged on the upper surface of the package substrate 100. The semiconductor chip 210 may include pads 212. The pads 212 may be arranged on a lower surface of the semiconductor chip 210. Thus, the lower surface of the semiconductor chip 210 may correspond to an active face of the semiconductor chip 210. The pads 212 may be electrically connected with the package substrate 100 via the conductive bumps 220. For example, the pads 212 may be connected to upper ends of the first contacts 123.

The molding member 230 may be formed on the upper surface of the package substrate 100 to cover the semiconductor chip 210. The molding member 230 may include an epoxy molding compound (EMC).

The external terminals 240 may be mounted on the redistribution pads 130b. For example, the external terminals 240 may be formed on the UBM layers 150 arranged on the redistribution pads 130b. The external terminals 240 may include solder balls.

Figure 9:
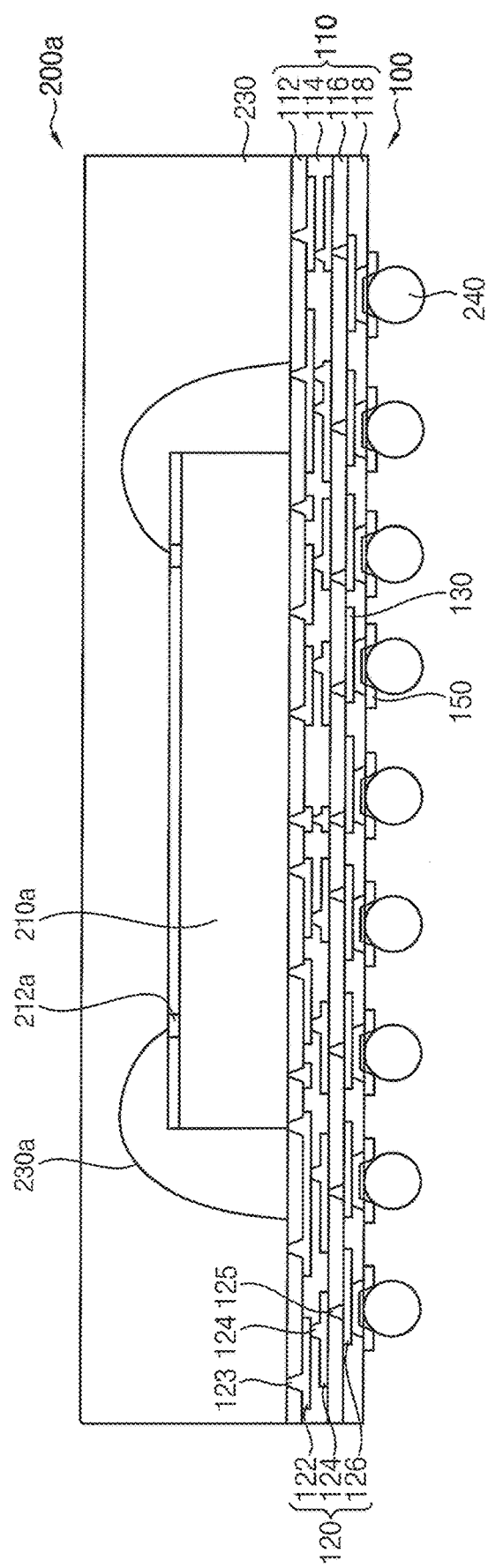

FIG. 9 is a cross-sectional view illustrating a semiconductor package in accordance with an example embodiment.

A semiconductor package 200a of some example embodiments may include elements the same as or substantially similar to those of the semiconductor package 200 in FIG. 8 except for an electrical connection between a semiconductor chip and a package substrate. Thus, the same reference numerals may refer to the same elements and any further illustrations with respect to the same elements may be omitted herein for brevity.

Referring to FIG. 9, a semiconductor chip 210a of the semiconductor package 200a may have an upper surface corresponding to the active face. Thus, pads 212a may be arranged on the upper surface of the semiconductor chip 210a. Conductive wires 230a may be connected between the pads 212a and the upper ends of the first contacts 123 in the package substrate 100.

Figure 10:
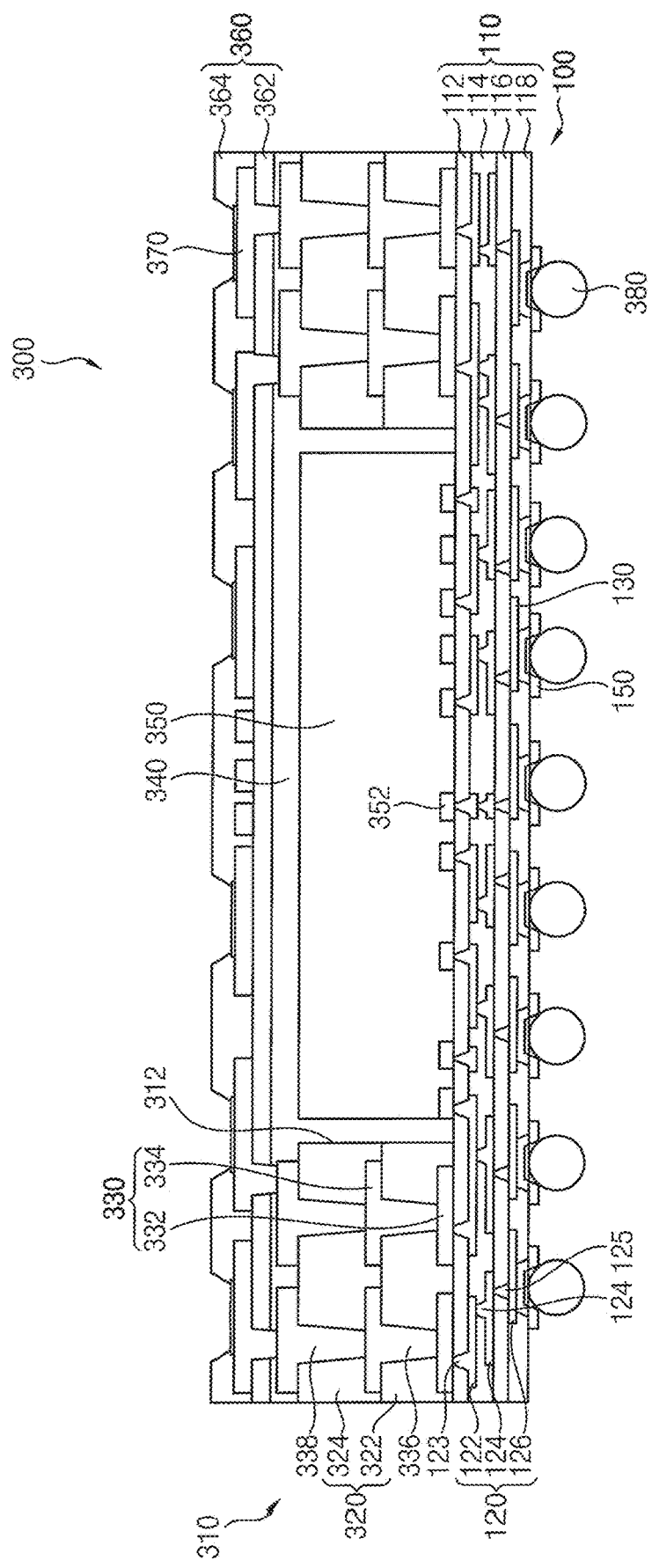
Figure 11:
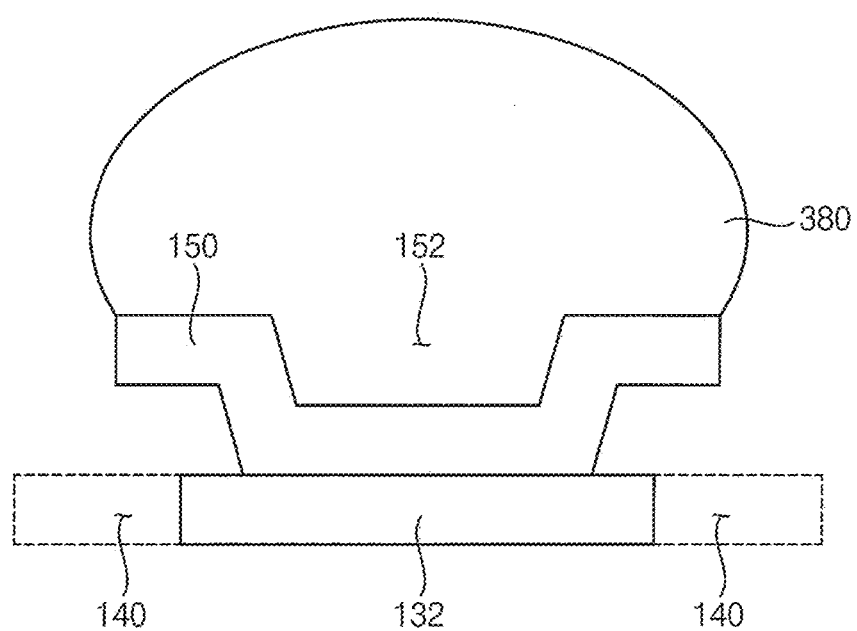

FIG. 10 is a cross-sectional view illustrating a fan-out type semiconductor package in accordance with an example embodiment, and FIG. 11 is an enlarged cross-sectional view illustrating a redistribution pad of the fan-out type semiconductor package in FIG. 10.

Referring to FIGS. 10 and 11, a fan-out type semiconductor package 300 of some example embodiments may include a package substrate 100, a frame 310, a semiconductor chip 350, a molding member 340, an upper RDL 370, an upper insulation layer 360 and external terminals 380.

The package substrate 100 may include the redistribution pad 130 in FIG. 2A or FIG. 2B, the redistribution pad 130a in FIG. 4, the redistribution pad 130b in FIG. 5A or FIG. 5B, or the redistribution pad 130c in FIG. 6A or FIG. 6B. Further, the package substrate 100 may have a structure the same as or substantially similar to that of the package substrate 100 in FIG. 1. Thus, any further illustrations with respect to the package substrate 100 may be omitted herein for brevity.

The semiconductor package of some example embodiments may correspond to the fan-out type. Therefore, the insulation substrate 110 and the RDL 120 of the package substrate 100 may correspond to a lower PID and a lower RDL of the fan-out type semiconductor package 300, respectively.

The frame 310 may be arranged on the upper surface of the package substrate 100. The frame 310 may include an insulation substrate 320 and a middle RDL 330. The insulation substrate 320 may include a cavity 312. The cavity 312 may be vertically formed through a central portion of the insulation substrate 320. The middle RDL 330 may be formed in the insulation substrate 320.

In some example embodiments, the insulation substrate 320 may include a first insulation layer 322 and a second insulation layer 324. The first insulation layer 322 may have an opening vertically formed through the first insulation layer 322. The second insulation layer 324 may be formed on an upper surface of the first insulation layer 322. The second insulation layer 324 may have an opening vertically formed through the second insulation layer 324.

The middle RDL 330 may include a first middle redistribution pattern 332 and a second middle redistribution pattern 334. The first middle redistribution pattern 332 may be formed on a lower surface of the first insulation layer 322. The second middle redistribution pattern 334 may be formed on the upper surface of the first insulation layer 322. The opening of the first insulation layer 322 may be filled with a first contact 336. Thus, the first middle redistribution pattern 332 and the second middle redistribution pattern 334 may be electrically connected with each other via the first contact 336. The opening of the second insulation layer 334 may be filled with a second contact 338. The second contact 338 may be electrically connected to the second middle redistribution pattern 334. An upper surface of the second contact 338 may be upwardly exposed.

In some example embodiments, the insulation substrate 320 may include a single insulation layer. In this case, the single middle RDL 330 may be exposed through the single insulation substrate 320. Further, the insulation substrate 320 may include at least three insulation layers.

The semiconductor chip 350 may be arranged in the cavity 312 of the insulation substrate 320. The semiconductor chip 350 may include a plurality of pads 352. The pads 352 may be arranged on a lower surface of the semiconductor chip 350. The semiconductor chip 350 may have an upper surface substantially coplanar with an upper surface of the insulation substrate 320. In some example embodiments, the upper surface of the semiconductor chip 350 may be positioned higher or lower than the upper surface of the insulation substrate 320.

The molding member 340 may be configured to mold the semiconductor chip 350. In some example embodiments, the molding member 340 may be formed on the upper surface of the insulation substrate 320 to fill a space between the semiconductor chip 350 and an inner surface of the cavity 312.

The upper insulation layer 360 may be formed on an upper surface of the molding member 340. In some example embodiments, the upper insulation layer 360 may include PID. In some example embodiments, the upper insulation layer 360 may include other insulation materials besides the PID.

The upper insulation layer 360 may include a first insulation layer 362 and a second insulation layer 364. The first insulation layer 362 may be formed on the upper surface of the molding member 340. The first insulation layer 362 may have an opening configured to expose the second contact connected to the second middle redistribution pattern 334.

The upper RDL 370 may be formed on an upper surface of the first insulation layer 362 to fill up the opening of the first insulation layer 362. Thus, the upper RDL 370 may be electrically connected to the second middle redistribution pattern 334 via the second contact 338.

The second insulation layer 364 may be formed on the upper surface of the first insulation layer 362. The second insulation layer 364 may have an opening configured to expose the upper RDL 370.

In some example embodiments, a second semiconductor chip may be arranged on an upper surface of the second insulation layer 364. A conductive bump of the second semiconductor chip may be arranged in the opening of the second insulation layer 364. The second semiconductor chip may be electrically connected with the upper RDL 370 via the conductive bump.

Figure 12:
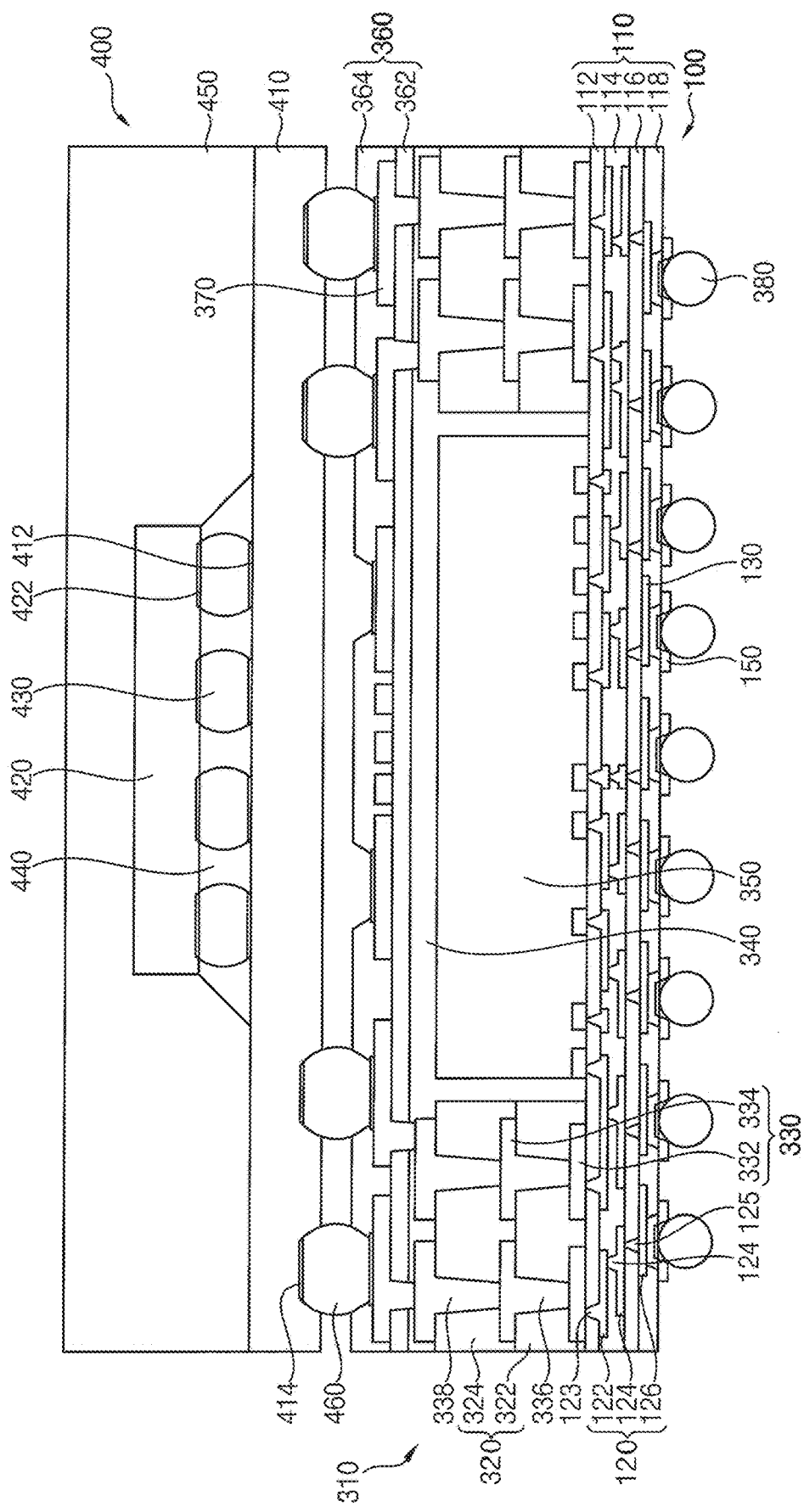

FIG. 12 is a cross-sectional view illustrating a semiconductor package in accordance with an example embodiment.

A semiconductor package 400 of some example embodiments may include elements the same as or substantially similar to those of the semiconductor package 300 in FIG. 10 except for further including a second semiconductor package. Thus, the same reference numerals may refer to the same elements and any further illustrations with respect to the same elements may be omitted herein for brevity.

Referring to FIG. 12, the semiconductor package 400 of some example embodiments may further include a second semiconductor package stacked on the semiconductor package 300 in FIG. 10. That is, the semiconductor package 400 may have a package-on-package (POP) structure.

The second semiconductor package may include a package substrate 410, a second semiconductor chip 420, conductive bumps 430, an underfilling layer 440 and a molding member 450.

The package substrate 410 may be electrically connected with the semiconductor package 300 in FIG. 10 via conductive bumps 460 such as solder balls. That is, the conductive bumps 460 may be mounted on the upper RDL 370 of the semiconductor package 300 in FIG. 10. A lower surface of the package substrate 410 may be electrically connected with the upper RDL 370 of the semiconductor package 300 via the conductive bumps 460.

The package substrate 410 may include a plurality of lower pads 414 and a plurality of upper pads 412. The lower pads 414 may be arranged on the lower surface of the package substrate 410. The lower pads 414 may make contact with the conductive bumps 460. The upper pads 412 may be arranged on an upper surface of the package substrate 410.

The second semiconductor chip 420 may be arranged on the upper surface of the package substrate 410. The second semiconductor chip 420 may include pads 422. The pads 422 may be arranged on a lower surface of the second semiconductor chip 420.

The conductive bumps 430 may be interposed between the package substrate 410 and the second semiconductor chip 420. For example, the conductive bumps 430 may electrically connect the upper pads 412 of the package substrate 410 to the pads 422 of the second semiconductor chip 420.

The underfilling layer 440 may be interposed between the package substrate 410 and the second semiconductor chip 420 to surround the conductive bumps 430. The underfilling layer 440 may include an insulation material such as an epoxy resin.

The molding member 450 may be formed on the upper surface of the package substrate 410 to cover the second semiconductor chip 420. The molding member 450 may include EMC.

FIG. 13 is a cross-sectional view illustrating a semiconductor package in accordance with an example embodiment.

Referring to FIG. 13, a semiconductor package 500 of some example embodiments may have a wafer level package structure. Therefore, the semiconductor package 500 may include a package substrate 100, a semiconductor chip 350, a molding member 520, a post 510, an upper RDL 370, an upper insulation layer 360 and external terminals 380.

The package substrate 100 may include the redistribution pad 130 in FIG. 2A or FIG. 2B, the redistribution pad 130a in FIG. 4, the redistribution pad 130b in FIG. 5A or FIG. 5B, or the redistribution pad 130c in FIG. 6A or FIG. 6B. Further, the package substrate 100 may have a structure the same as or substantially similar to that of the package substrate 100 in FIG. 1. Thus, any further illustrations with respect to the package substrate 100 may be omitted herein for brevity.

The molding member 520 may be formed on the upper surface of the package substrate 100 to surround side surfaces of the semiconductor chip 350. The molding member 520 may correspond to a part of a wafer.

The post 510 may be vertically formed in the molding member 520. A lower end of the post 510 may be electrically connected to the package substrate 100. Particularly, the lower end of the post 510 may be electrically connected to the first contact 123 of the first RDL 122. The post 510 may include metal such as copper.

The upper insulation layer 360 and the upper RDL 370 may have structures the same as or substantially similar to the structures in FIG. 10. Thus, any further illustrations with respect to the upper insulation layer 360 and the upper RDL 370 may be omitted herein for brevity. An upper end of the post 510 may be electrically connected to the upper RDL 370.

According to some example embodiments, the at least one segmenting groove formed in the radial direction of the redistribution pad may reduce an area of the redistribution pad. Thus, physical stress to the PID disposed over the redistribution pad may be suppressed, thereby decreasing generation of cracks in the PID. Thus, spreading of the cracks toward the redistribution pad from the PID may also be suppressed to provide the semiconductor package with improved reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package substrate comprising:
    an insulation substrate;
    at least one redistribution layer (RDL) included in the insulation substrate; and
    a redistribution pad extending from the RDL, the redistribution pad including at least one segmenting groove along a radial direction of the redistribution pad, the segmenting groove including a first segmenting groove portion and a second segmenting groove portion, the second segmenting groove portion being between the first segmenting groove portion and a central portion of the redistribution pad,
    wherein the segmenting groove extends from an outer surface of the redistribution pad toward the central portion of the redistribution pad and a length of the segmenting groove in the radial direction is about 19% to about 22% of a radius of the redistribution pad.

2. The package substrate of claim 1, wherein the segmenting groove has a uniform width.

3. The package substrate of claim 2, wherein the uniform width of the segmenting groove is about 20 µm to about 35 µm.

4. The package substrate of claim 1, wherein the segmenting groove has widths gradually decreasing from the outer surface of the redistribution pad toward the central portion of the redistribution pad.

5. The package substrate of claim 1, wherein the segmenting groove comprises a plurality of segmenting grooves spaced apart from each other by a uniform gap with respect to the central portion of the redistribution pad.

6. The package substrate of claim 1, wherein the redistribution pad further comprises a second segmenting groove.

7. The package substrate of claim 1, further comprising:
an under bump metal (UBM) layer arranged on the redistribution pad.

8. The package substrate of claim 1, wherein
the insulation substrate comprises stacked insulation layers, and
the RDL comprises a plurality of redistribution patterns that are arranged between the stacked insulation layers and are connected with each other.

9. The package substrate of claim 8, wherein the redistribution pad extends from a lowermost redistribution pattern among the redistribution patterns.

10. The package substrate of claim 8, wherein the stacked insulation layers comprise a photoimageable dielectric (PID).

11. A semiconductor package comprising:
a package substrate including an insulation substrate, at least one redistribution layer (RDL) included in the insulation substrate, and a redistribution pad extending from the RDL, the redistribution pad including at least one segmenting groove along a radial direction of the redistribution pad, the segmenting groove including a first segmenting groove portion and a second segmenting groove portion, the second segmenting groove portion being between the first segmenting groove portion and a central portion of the redistribution pad;
a semiconductor chip on an upper surface of the package substrate and electrically connected to the RDL; and
an external terminal on the redistribution pad,
wherein the segmenting groove extends from an outer surface of the redistribution pad toward central portion of the redistribution pad and a length of the segmenting groove in the radial direction is about 19% to about 22% of a radius of the redistribution pad.

12. The semiconductor package of claim 11, wherein the segmenting groove extends from the outer surface of the redistribution pad toward the central portion of the redistribution pad.

13. The semiconductor package of claim 11, wherein the segmenting groove comprises a plurality of segmenting grooves spaced apart from each other by a uniform gap with respect to the central portion of the redistribution pad.

14. The semiconductor package of claim 11, wherein
the insulation substrate comprises stacked insulation layers, and
the RDL comprises a plurality of redistribution patterns that are arranged between the stacked insulation layers and connected with each other.

15. The semiconductor package of claim 14, wherein the redistribution pad extends from a lowermost redistribution pattern among the redistribution patterns.

16. The semiconductor package of claim 11, further comprising:
an under bump metal (UBM) layer interposed between the redistribution pad and the external terminal.

17. A fan-out type semiconductor package comprising:
a semiconductor chip;
a lower photoimageable dielectric (PID) on a lower surface of the semiconductor chip, the lower PID protruding from side surfaces of the semiconductor chip;
a lower redistribution layer (RDL) in the lower PID and electrically connected to the semiconductor chip; and
a plurality of redistribution pads extending from the lower RDL, a respective redistribution pad of the redistribution pads including at least one segmenting groove along a radial direction of the respective redistribution pad, the segmenting groove including a first segmenting groove portion and a second segmenting groove portion, the second segmenting groove portion being between the first segmenting groove portion and a central portion of the redistribution pad,
wherein the segmenting groove extends from an outer surface of the respective redistribution pad toward the central portion of the respective redistribution pad and a length of the segmenting groove in the radial direction is about 19% to about 22% of a radius of the redistribution pad.

18. The fan-out type semiconductor package of claim 17, wherein
the lower PID comprises stacked insulation layers, and
the lower RDL comprises a plurality of redistribution patterns that are arranged between the stacked insulation layers and are connected with each other.

19. The fan-out type semiconductor package of claim 18, wherein each of the redistribution pads extends from a lowermost redistribution pattern among the redistribution patterns.

20. The fan-out type semiconductor package of claim 17, further comprising:
an under bump metal (UBM) layer on each of the redistribution pads; and
an external terminals on the UBM layer.

* * * * *

UNITED STATES PATENT AND TRADEMARK OFFICE
CERTIFICATE OF CORRECTION

| | | |
|---|---|---|
| PATENT NO. | : 11,756,908 B2 | Page 1 of 1 |
| APPLICATION NO. | : 17/718639 | |
| DATED | : September 12, 2023 | |
| INVENTOR(S) | : Youngkyu Lim et al. | |

It is certified that error appears in the above-identified patent and that said Letters Patent is hereby corrected as shown below:

On the Title Page

Item (54) and in the Specification, Column 1 Line 1, should read as follows:
PACKAGE SUBSTRATE INCLUDING A REDISTRIBUTION PAD EXTENDING FROM A REDISTRIBUTION LAYER AND INCLUDING SEGMENTING GROOVES ALONG A RADIAL DIRECTION THEREOF AND SEMICONDUCTOR PACKAGE INCLUDING THE SAME Signed and Sealed this
Twelfth Day of December, 2023

Katherine Kelly Vidal
*Director of the United States Patent and Trademark Office*